(12) United States Patent
Bickford et al.

(10) Patent No.: US 7,089,132 B2
(45) Date of Patent: Aug. 8, 2006

(54) METHOD AND SYSTEM FOR PROVIDING QUALITY CONTROL ON WAFERS RUNNING ON A MANUFACTURING LINE

(75) Inventors: Jeanne P. Bickford, Essex Junction, VT (US); Vernon R. Norman, Cary, NC (US); Michael R. Ouellette, Westford, NC (US); Mark S. Styduhar, Hinesburg, VT (US); Brian Worth, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 10/709,805

(22) Filed: May 28, 2004

(65) Prior Publication Data

US 2005/0267705 A1 Dec. 1, 2005

(51) Int. Cl.
*G01N 37/00* (2006.01)
*G01R 31/26* (2006.01)
(52) U.S. Cl. .......................... 702/84; 702/81; 324/765
(58) Field of Classification Search ................ 702/84, 702/35, 81, 82, 83; 324/763, 764, 765, 549
See application file for complete search history.

(56) References Cited

U.S. PATENT DOCUMENTS

2005/0017746 A1* 1/2005 Matsumoto et al. ........ 324/763

* cited by examiner

*Primary Examiner*—John Barlow
*Assistant Examiner*—Meagan S Walling
(74) *Attorney, Agent, or Firm*—Michael J. LeStrange; Dillon & Yudell, LLP

(57) ABSTRACT

A method for providing quality control on wafers running on a manufacturing line is disclosed. The resistances on a group of manufacturing test structures within a wafer running on a wafer manufacturing line are initially measured. Then, an actual distribution value is obtained based on the result of the measured resistances on the group of manufacturing test structures. The difference between the actual distribution value and a predetermined distribution value is recorded. Next, the resistances on a group of design test structures within the wafer are measured. The measured resistances of the group of design test structures are correlated to the measured resistances of the group of manufacturing test structures in order to obtain an offset value. The resistance of an adjustable resistor circuit within the wafer and subsequent wafers running on the wafer manufacturing line are adjusted according to the offset value.

13 Claims, 2 Drawing Sheets

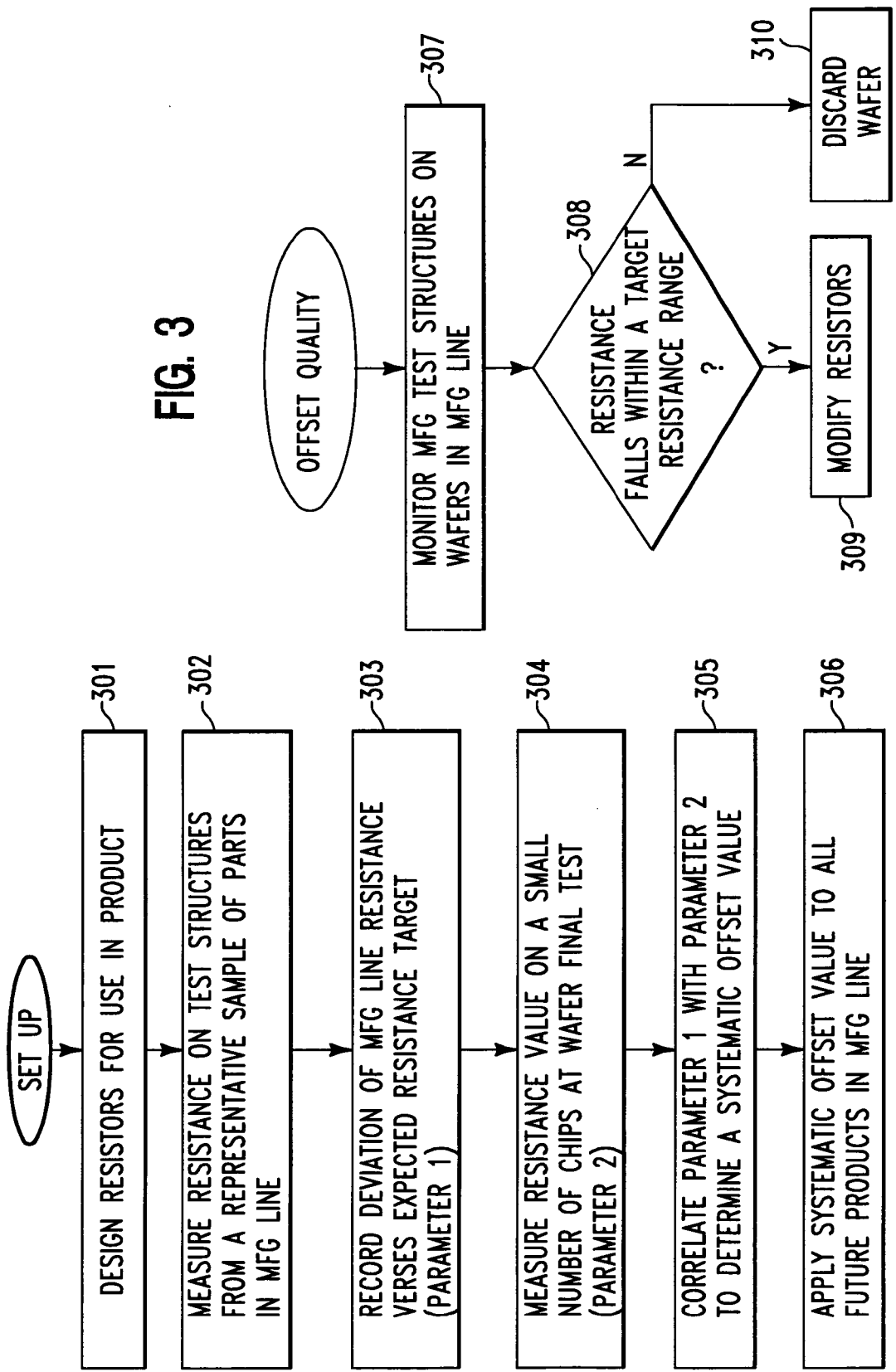

METHOD AND SYSTEM FOR PROVIDING QUALITY CONTROL ON WAFERS RUNNING ON A MANUFACTURING LINE

BACKGROUND OF INVENTION

1. Technical Field

The present invention relates in general to integrated circuit manufacturing and, in particular, to a method and system for improving yield loss caused by wafer manufacturing line variations. Still more particularly, the present invention is related to a method and system for providing quality control on wafers running on a wafer manufacturing line without requiring process changes or product redesign.

2. Description of Related Art

A typical manufacturing process for an integrated circuit begins with the fabrication of a semiconductor wafer containing hundreds or even thousands of identical chip that each includes integrated circuits. Following wafer fabrication, a quick first pass wafer probe is typically performed in an attempt to identify chips on the wafer having defects. Depending on the number and type of defects that are detected, corrective action, such as laser fusing, may be taken to improve yield. Once any such corrective steps have been performed, the wafer may be subjected to a second pass wafer probe to determine the efficacy of the corrective steps in addressing detected defects, and any chips failing the second pass wafer probe are marked as faulty.

Following the second pass wafer probe, the wafer is scribed into chips, and chips passing the wafer probes are packaged into packaged integrated circuit devices. After packaging, the packaged integrated circuit devices are then subjected to device-level testing to detect additional faults. Such device-level testing may include a burn-in test in which the packaged integrated circuit devices are subjected to high ambient temperatures and tests of long duration in order to discover early life failures. In addition, the device-level testing may include scan based testings, functional logic testings and DC and AC characteristic testings.

The central focus in the conventional manufacturing process outlined above is to improve yield and decrease the number of integrated circuits, devices and modules that are discarded due to uncorrected faults. Accordingly, much effort has been focused on the detection and correction of faults during the manufacturing process. Unfortunately, test identifies yield issues after the manufacturing process has been implemented and the product already designed. Changes to either the manufacturing process or the product design are very expensive and time-consuming.

Since manufacturing processes that control resistance are impacted by the need to adjust base process elements such as threshold voltage, resistances often are not centered at the middle of line specifications and expensive process changes such as adding additional masking levels or complete product design are needed to ensure that the product will meet acceptable yield levels. Current techniques to modify resistance through the use of fuses requires installation of custom test circuits within the chip, which requires the use of substantial silicon area and long expensive test times. Such technique is seldom used because of the associated high expense.

SUMMARY OF INVENTION

In view of the foregoing and other shortcomings in the prior art, the present invention provides a method and system for providing quality control on wafers running on a wafer manufacturing line without changing the manufacturing process, redesigning the product, or incurring the cost of current techniques to test and modify resistors on a particular product. In accordance with a preferred embodiment of the present invention, the resistances on a group of manufacturing test structures within a wafer running on a wafer manufacturing line are initially measured. Then, an actual distribution value is obtained based on the result of the measured resistances on the group of manufacturing test structures. The difference between the actual distribution value and a predetermined distribution value is recorded. The predetermined distribution value is previously obtained based on a ground rule resistance. Next, the resistances on a group of design test structures within the wafer are measured. The measured resistances of the group of design test structures are correlated to the measured resistances of the group of manufacturing test structures in order to obtain an offset value. The resistance of an adjustable resistor circuit within the wafer is then adjusted accordingly, and subsequent wafers running on the wafer manufacturing line are also adjusted according to the offset value.

All features and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 3 is a high-level logic flow diagram of a method for providing quality control on wafers running on a wafer manufacturing line, in accordance with a preferred embodiment of the present invention.

DETAILED DESCRIPTION

Figure 1:
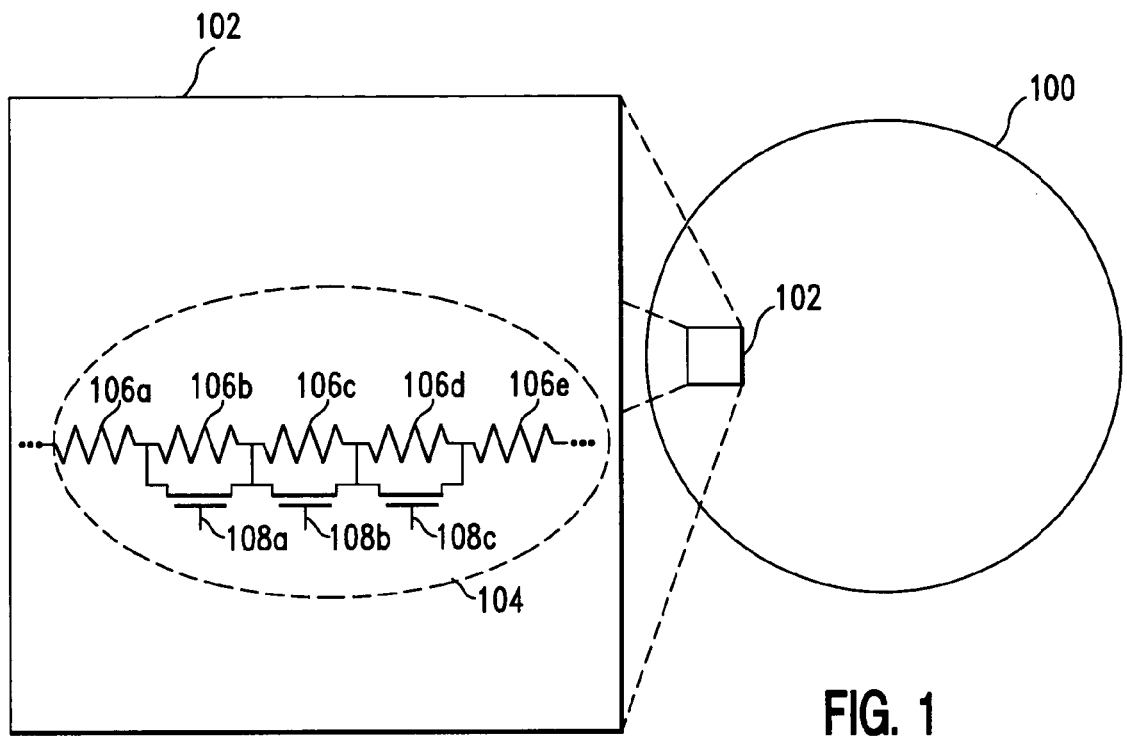
FIG. 1 illustrates a wafer having at least one integrated circuit chip containing an adjustable impedance resistor chain circuit.

Referring now to the drawings and in particular to FIG. 1, there is illustrated a plan view of a semiconductor wafer in accordance with a preferred embodiment of the present invention. As shown, a wafer 100, which may be formed of silicon, germanium or other semiconductor material, has at least one surface upon which multiple instances of integrated circuits are fabricated. Each instance of the integrated circuits is referred to hereafter as a chip 102.

Each chip 102 may include any number of circuit elements (e.g., transistors, capacitors, inductors, diodes, resistors, clocks, etc.) that are interconnected to perform one or more desired circuit functions, such as computation, communication and storage. As shown in FIG. 1, the integrated circuitry within chip 102 includes an adjustable resistance circuit 104 containing one or more resistances, for example, the resistor chain including resistors 106a–106e, as well as means for adjusting the total resistance of adjustable resistor circuit 104. In the illustrated embodiment, the means for adjusting the resistance of adjustable resistance circuit 104 includes electronic fuses 108a–108c, which may be individually "blown" by applying a high voltage to the appropriate input(s).

In alterative embodiments, electronic fuses 108a–108c may be replaced with conventional laser fuses. In either embodiment, the overall resistance presented by adjustable resistor circuit 104 may be changed by blowing any or all of fuses 108a–108c to change the total resistance of adjustable resistor circuit 104 by the resistance of resistor 106a, 106b and/or 106c.

Figure 2:
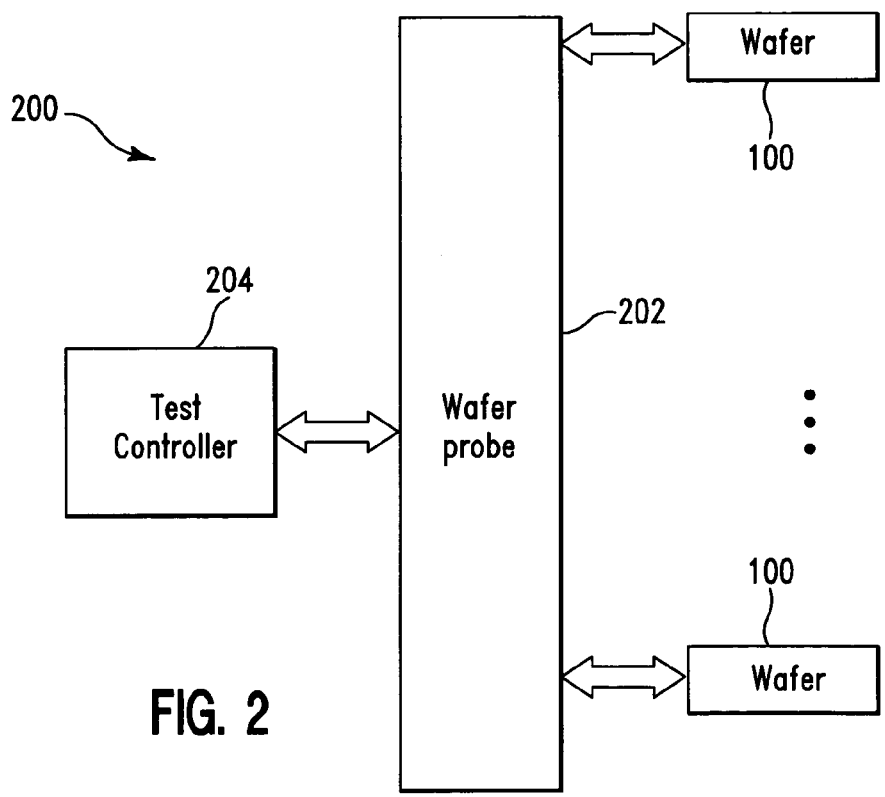
FIG. 2 is a block diagram of a wafer testing system in accordance with the present invention.

With reference now to FIG. 2, there is illustrated a block diagram of a wafer testing system, in accordance with a preferred embodiment of the present invention. As depicted, a wafer testing system 200 includes a wafer probe 202 having probe tips capable of making contact with one or more pads within the test structure of wafer 100 and/or chip 102 on wafers 100. Coupled to wafer probe 202 is a test controller 204, such as a general or special purpose computer, that directs the testing of wafers 100. For example, test controller 204 may include circuitry and/or programming to conduct DC and AC characterization tests and functional tests of chip 102 on wafers 100 in accordance with a desired testing methodology. Test controller 204 also preferably includes circuitry and/or programming to correct certain detected faults, for example, by applying high voltage to selected electronic fuses 108.

Referring now to FIG. 3, there is depicted a high-level logic flow diagram of a method for providing quality control on wafers running on a wafer manufacturing line, in accordance with a preferred embodiment of the present invention. The method can be broadly divided into two stages, namely, a set up stage and an offset qualify stage. During the set up stage, resistors (such as those depicted in FIG. 1) are initially incorporated within an integrated circuit design, as shown in block 301. Then, in a wafer manufacturing line, a representative group of integrated circuits on a wafer is selected for the purpose of measuring the resistances on the manufacturing test structures within the integrated circuits, as depicted in block 302. The distribution value of the measured resistances on the manufacturing test structures is denoted as the "actual manufacturing resistance." The actual manufacturing resistance is compared with a predetermined manufacturing resistance distribution value, and the difference is recorded in a database, as shown in block 303. The predetermined manufacturing resistance distribution value is calculated based on the ground rule resistance of the integrated circuit design.

At the end of the wafer manufacturing line in which the wafer has been processed, a small representative group of the integrated circuits on the wafer is selected for the purpose of measuring the resistances on the design test structures within the integrated circuits, as depicted in block 304. The distribution value of the measured resistances on the design test structures is denoted as the "design test structure resistance." The design test structure resistance is then correlated with the difference between the actual manufacturing resistance and the predetermined manufacturing resistance distribution value (as recorded in block 303) to determine a systematic offset value, as shown in block 305. Such systematic offset value is to be applied to all subsequent wafers on the wafer manufacturing line during the offset qualifying stage, as will be described.

During the offset qualify stage, the resistances of the manufacturing test structures of all wafers on the wafer manufacturing line are monitored to ensure the resistances fall within a tolerance value from the previously measured manufacturing resistance value (from block 302), as shown in block 307. A determination is made as to whether or not the resistance of a wafer falls within a tolerance value (or a range) from the previously measured manufacturing resistance value, as depicted in block 308. If the resistance of the wafer falls within the tolerance value from the previously measured manufacturing resistance value, the previously recorded value stored in the database (from block 303) is utilized to modify the resistance on the integrated circuits on the wafer, as depicted in block 309. The resistance modification can be performed via "blowing up" fuse, as it is well-known in the art. Otherwise, if the resistance of the wafer does not fall within a tolerance value from the previously measured manufacturing resistance value, the wafer will be discarded, as shown in block 310.

As has been described, the present invention provides a method and system for providing quality control on wafers running on a wafer manufacturing line without requiring process changes or product redesign. One advantage of the depicted testing methodology is that the average time and expense of wafer testing is reduced by performing corrective measures (e.g., blowing fuses) on an entire wafer line instead of on a per wafer basis.

Although the present invention has been described in the context of a fully functional testing system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

While the invention has been particularly shown and described with reference to a preferred embodiment, it will be understood by those skilled in the art that various changes in form and detail may be made therein without departing from the spirit and scope of the invention.

The invention claimed is:

1. A method for providing quality control of a wafer manufacturing line, said method comprising:
   measuring resistances on a plurality of manufacturing test structures within a wafer running on a wafer manufacturing line;
   obtaining an actual distribution value based on the result of said measured resistances on said plurality of manufacturing test structures;
   recording the difference between said actual distribution value and a predetermined distribution value, wherein said predetermined distribution value is obtained based on a ground rule resistance;
   measuring resistances on a plurality of design test structures within said wafer;
   correlating said measured resistance of said design test structures to said measured resistance of said manufacturing test structures to obtain an offset value; and
   adjusting resistances of an adjustable resistor circuit within said wafer and subsequent wafers running on said wafer manufacturing line according to said offset value.

2. The method of claim 1, wherein said method further includes monitoring manufacturing test structures on wafers on said wafer manufacturing line.

3. The method of claim 2, wherein said method further includes adjusting resistances of an adjustable resistor circuit within a wafer on said wafer manufacturing line according to said offset value if the resistance of said manufacturing test structures on said wafer fails within a target resistance range.

4. The method of claim 3, wherein said method further includes discarding a wafer if the resistance of said manufacturing test structures on said wafer does not fall within said target resistance range.

5. A wafer testing system for providing quality control of a wafer manufacturing line, said wafer testing system comprising:

means for measuring resistances on a plurality of manufacturing test structures within a wafer running on a wafer manufacturing line;

means for obtaining an actual distribution value based on the result of said measured resistances on said plurality of manufacturing test structures;

means for recording the difference between said actual distribution value and a predetermined distribution value, wherein said predetermined distribution value is obtained based on a ground rule resistance;

means for measuring resistances on a plurality of design test structures within said wafer;

means for correlating said measured resistance of said design test structures to said measured resistance of said manufacturing test structures to obtain an offset value; and means for adjusting resistances of an adjustable resistor circuit within said wafer and subsequent wafers running on said wafer manufacturing line according to said offset value.

6. The system of claim 5, wherein said system further includes means for monitoring manufacturing test structures on wafers on said wafer manufacturing line.

7. The system of claim 6, wherein said system further includes means for adjusting resistances of an adjustable resistor circuit within a wafer on said wafer manufacturing line according to said offset value if the resistance of said manufacturing test structures on said wafer falls within a target resistance range.

8. The system of claim 7, wherein said system further includes means for discarding a wafer if the resistance of said manufacturing test structures on said wafer does not fall within said target resistance range.

9. A computer readable medium having computer program product for providing quality control of a wafer manufacturing line, said computer readable medium comprising:

program code means for measuring resistances on a plurality of manufacturing test structures within a wafer running on a wafer manufacturing line;

program code means for obtaining an actual distribution value based on the result of said measured resistances on said plurality of manufacturing test structures;

program code means for measuring resistances on a plurality of design test structures within said wafer;

program code means for correlating said measured resistance of said design test structures to said measured resistance of said manufacturing test structures to obtain an offset value; and program code means for adjusting resistances of an adjustable resistor circuit within said wafer and subsequent wafers running on said wafer manufacturing line according to said offset value.

10. The computer readable medium of claim 9, wherein said computer readable medium includes program code means for recording the difference between said actual distribution value and a predetermined distribution value, wherein said predetermined distribution value is obtained based on a ground rule resistance.

11. The computer readable medium of claim 9, wherein said computer readable medium further includes program code means for monitoring manufacturing test structures on wafers on said wafer manufacturing line.

12. The computer readable medium of claim 11, wherein said computer readable medium further includes program code means for adjusting resistances of an adjustable resistor circuit within a wafer on said wafer manufacturing line according to said offset value if the resistance of said manufacturing test structures on said wafer falls within a target resistance range.

13. The computer readable medium of claim 12, wherein said computer readable medium further includes program code means for discarding a wafer if the resistance of said manufacturing test structures on said wafer does not fall within said target resistance range.

* * * * *